United States Patent [19]

Johnson et al.

[11] 4,161,746

[45] Jul. 17, 1979

[54] GLASS SEALED DIODE

[75] Inventors: Joseph E. Johnson, Churchill; John A. Ostop, Greensburg; David L. Moore, Jeannette, all of Pa.

[73] Assignee: Westinghouse Electric Corp., Pittsburgh, Pa.

[21] Appl. No.: 891,090

[22] Filed: Mar. 28, 1978

[51] Int. Cl.² .......................................... H01L 23/02
[52] U.S. Cl. ...................................... 357/73; 357/68; 357/72; 357/81
[58] Field of Search ................... 357/68, 72, 73, 81

[56] References Cited
U.S. PATENT DOCUMENTS 3,475,662  10/1969  Zido ........................................ 357/72
3,517,272   6/1970  Lee et al. ................................ 357/73

Primary Examiner—Edward J. Wojciechowicz
Attorney, Agent, or Firm—J. B. Hinson

[57] ABSTRACT

A glass sealed semiconductor diode is disclosed. The diode includes a fusion which comprises a body of semiconductor material having a PN junction therein and metal electrodes affixed to opposed major surfaces of the semiconductor body. The fusion is encircled by an annular-shaped glass member with an inner surface of the annular-shaped glass member fused to an edge surface of the fusion to form a protective layer over the PN junction. An annular metallic member encircles the annular glass member with an inner surface thereof fused to an outer surface of the annular glass member.

18 Claims, 12 Drawing Figures

FIG. 9.
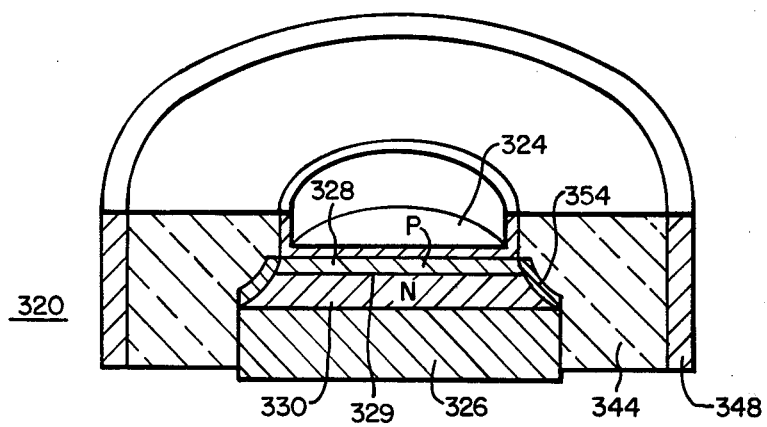
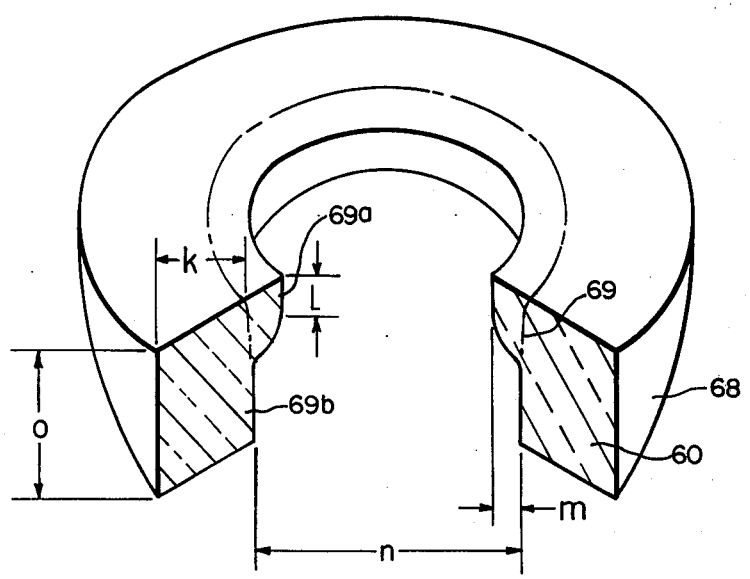
FIG. 10.

GLASS SEALED DIODE

BACKGROUND OF THE INVENTION

1. Description of the Prior Art

Prior art semiconductor diodes using glass fused directly to the semiconductor portion of the diode for purposes of protecting the PN junction have been limited to relatively small low current diodes. An example of such a diode is type UT4005 manufactured and sold by the Unitrode Corporation. It is also known in the prior art to encapsulate semiconductor devices in thermosetting resinous insulating material. Examples of devices hermetically sealed diodes using resinous materials are disclosed in U.S. Pat. Nos. 3,475,662; 3,476,987 and 3,476,988 as well as 3,486,084.

2. Summary of the Invention

The diode which is the subject of this invention utilizes a body of semiconductor material which includes a PN junction formed by P and N regions respectively extending from the PN junction to opposed substantially flat major surfaces of the body of semiconductor material. The area of the PN junction is coextensive with the area of the body of semiconductor material. That is, the junction extends entirely across the body and terminates at an edge portion of the body. The edge portion of the body extending from one major surface to the other. Electrodes are affixed to the opposed major surfaces of the body of semiconductor material by soldering, brazing or any other suitable techniques known to those skilled in the art. The area of each of the electrodes is substantially coextensive with the area of the surface of the body of semiconductor material to which they are affixed. The body of semiconduct material and the electrodes affixed thereto are for convenience referred to as a fusion.

The fusion is encircled by an annular or ringshaped glass member having inner and outer surfaces. The inner surface of the annular-shaped glass member is fused to the edge of the body of semiconductor material to form a seal protecting the PN junction. An annular or ring-shaped metallic member having inner and outer surfaces, encircles the annular-shaped glass member with the outer surface of the annular-shaped glass member fused to the inner surface of the annular-shaped metallic member. In the preferred embodiment the glass for the annular-shaped glass member and the metal for the annular-shaped metallic member are selected such that the annular metallic member maintains the annular glass member in compression for normal temperature operating ranges of the diode. The glass for the annular-shaped glass member must also be substantially alkaline-free to prevent contamination of the PN junction.

DESCRIPTION OF DRAWINGS

FIG. 9 is a fourth embodiment of the diode which comprises the invention with portions shown in cross section.

FIG. 10 is a drawing of a glass perform used in constructing the diode.

DESCRIPTION OF PREFERRED EMBODIMENT

Figure 1:
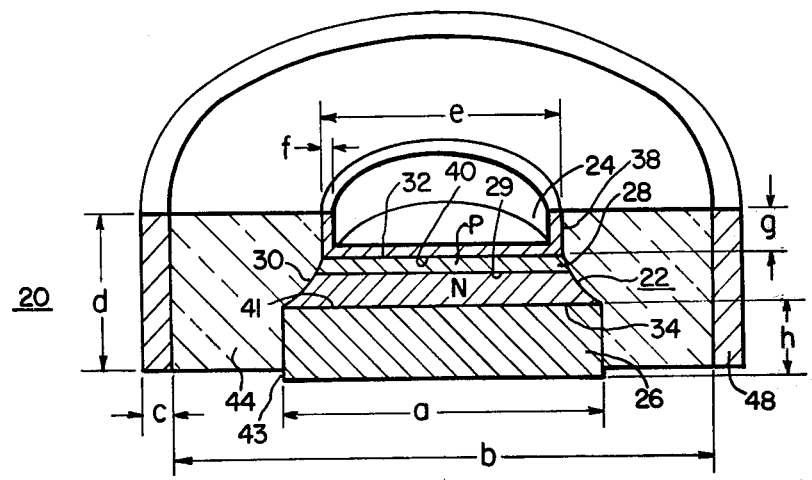
FIG. 1 is a drawing illustrating the preferred embodiment of the diode which comprises the invention with portions shown in cross section.

FIG. 1 is a drawing illustrating the preferred embodiment of a diode 20 which comprises the present invention. Component parts of the diode 20 are separately illustrated in FIGS. 2 through 6.

Figure 3:
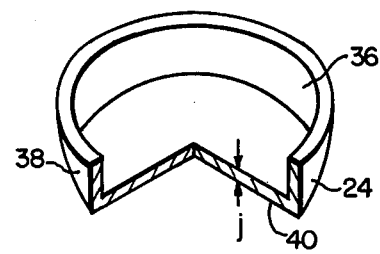
FIG. 3 is a drawing illustrating a first electrode of the diode.
Figure 4:
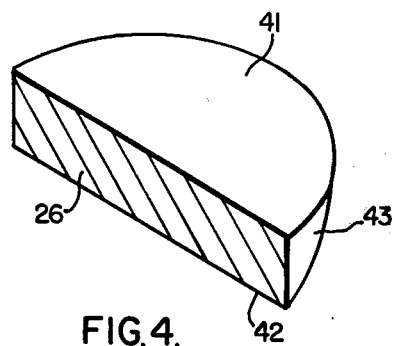
FIG. 4 is a drawing illustrating a second electrode of the diode.

Diode 20 utilizes a fusion consisting of a body of semiconductor material, preferably silicon, 22 (separately illustrated in FIG. 2) and first and second electrodes 24 and 26 (separately illustrated in FIGS. 3 and 4). Electrodes 24 and 26 are preferably a refractory metal, such as molybdenum, tungsten and tantalum, for example. Alloys of the refractory metals are also usable.

The body of semiconductor material 22 includes a PN junction 29 at the interface of P conductivity type region 28 and N conductivity type region 30. The P conductivity type region 28 extends from the junction 29 to an upper surface 32 of the body of semiconductor material 22 while the N conductivity type region 30 extends from the junction 29 to a lower surface 34 of the body of semiconductor material 22. Electrode 24 is preferably cup-shaped and includes a lower surface 40 which is affixed to upper surface 32 of the body of semiconductor material 22. Similarly, electrode 26, separately illustrated in FIG. 4 includes a top surface 41, which is affixed to the lower surface 34 of the body of semiconductor material 22. Electrodes 24 and 26 may be affixed to the body of semiconductor material 22 respectively by soldering, brazing or any other suitable technique known to those skilled in the art.

Figure 5:
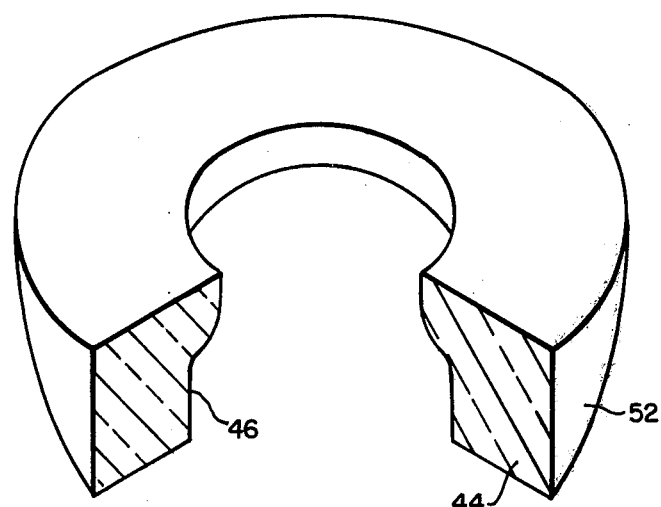
FIG. 5 is a drawing of the annular-shaped glass member utilized in the diode.

The fusion, consisting of the body of semiconductor material 22 and electrodes 24 and 26, is encircled by preferably coaxially positioned annular-shaped electrically insulating glass member 44 separately illustrated in FIG. 5. (Coaxially positioned means that the fusion and the annular-shaped glass member 44 have a common vertical axis of symmetry.) Inner surface 46 of annular-shaped glass member 44 is fused to edge portion 33 of the body of semiconductor material 22 as well as to outer surfaces 38 and 43 of electrodes 24 and 26 respectively. A fused junction formed along the inner surface 46 of annular-shaped glass member 44 and the outer edge portion 33 of the body of semiconductor material 22 provides a hermetic seal protecting the PN junction 29. Additional protection is provided by the fused junction between the inner surface 46 of annular-shaped glass member 44 and the outer surfaces, 38 and 43, of the electrodes 24 and 26.

In some applications it may be desirable to select the materials for the electrodes 24 and 26 and the annular shaped glass member 44 such that the annular glass member 44 does not fuse to the edge surfaces 38 and 43 of electrodes 24 and 26. In this case environmental protection for the PN junction 29 is provided entirely by the fused junction between the inner surface 46 of annular-shaped glass member 44 and the outer surface 33 of the body of semiconductor material 22.

Figure 6:
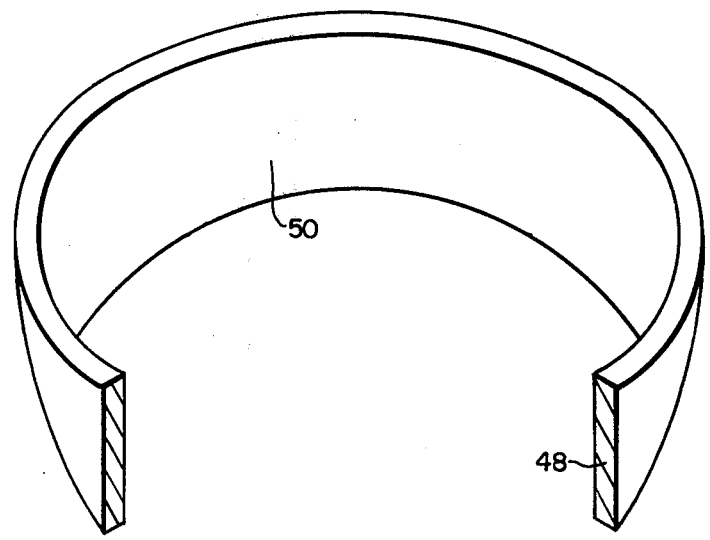
FIG. 6 is a drawing of the annular-shaped metal member utilized in the diode.

Annular-shaped glass member 44 is encircled by a preferably coaxially positioned annular or ring-shaped metallic member 48 separately illustrated in FIG. 6. (Co-axially positioned means that annular-shaped glass member 44 and annular-shaped metallic member 48 have a common axis of symmetry.) Inner surface 50 of annular-shaped metallic member 48 contacts and is fused to outer surface 52 of the annular-shaped glass member 44. In the preferred embodiment the temperature expansion coefficients of the annular-shaped glass member 44 and the annular-shaped metallic member 48 are selected such that during normal operating temperatures the annular-shaped metallic member 48 maintains the annular-shaped glass member 44 in compression. The preferred material for annular-shaped metallic member 48 is an alloy consisting of 20% nickel, 17% cobalt, 0.2% manganese with the balance iron and sold under the trademark KOVAR or Fenico. Steels having expansion coefficients approximating that of the above alloy may also be used. Ceramics, including zircon ($ZrSiO_4$), mullite ($3AL_2O_3 2SiO_2$), procelain, titania ($TiO_2$) and spinel ($MgAL_2O_4$) are also useable.

Bottom electrode 26 extends beyond the lower surface of annular-shaped glass member 44 and the lower surface of annular-shaped metallic member 48. This permits contact to the bottom electrode 26 to be made through a flat surface without interference by annular-shaped metallic member 48.

Embodiments of the diode 20 actually constructed have a voltage rating of 600 volts, a current rating of 150 amps and the following dimensions:

| Dimension Identification Character | Dimension in Inches |
|---|---|
| a (FIG. 1) | 0.625 |
| b (FIG. 1) | 0.915 |
| c (FIG. 1) | 0.052 |
| d (FIG. 1) | 0.068 |
| e (FIG. 1) | 0.480 |
| f (FIG. 1) | 0.010 |
| g (FIG. 1) | 0.040 |
| h (FIG. 1) | 0.035 |
| i (FIG. 2) | 0.010 |
| j (FIG. 3) | 0.010 |

Figure 7:
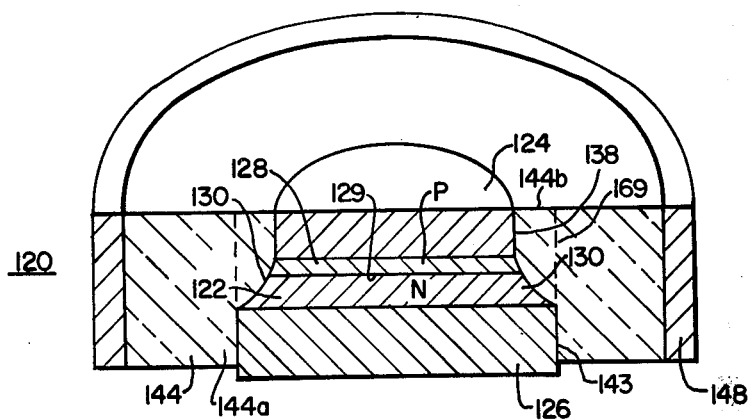
FIG. 7 is a second embodiment of the diode which comprises the invention with portions shown in cross section.

FIG. 7 illustrates a second embodiment of the glass encapsulated diode 120 which is the subject of this invention. The same numbers used in FIG. 1 plus 100 have been used to identify similar parts. For example, the top electrode 24 illustrated in FIG. 1 is identified by the number 124 in FIG. 2.

The diode 120 illustrated in FIG. 7 is essentially identical with the diode 20 illustrated in FIG. 1 except that the top electrode 124 is a flat disc rather than cup-shaped as illustrated in FIG. 1. This and the other embodiments can be constructed such that annular-shaped glass member 144 includes two regions, 144a and 144b, of different type of glass. This will be discussed in more detail later with reference to the glass perform illustrated in FIG. 10.

Figure 8:
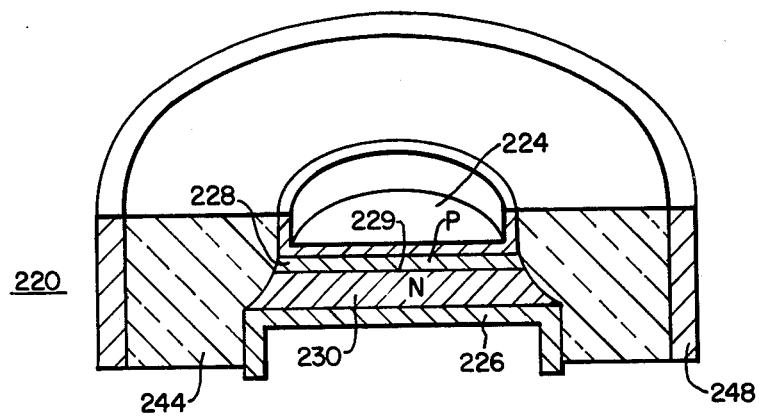
FIG. 8 is a third embodiment of the diode which comprises the invention with portions shown in cross section.
Figure 2:
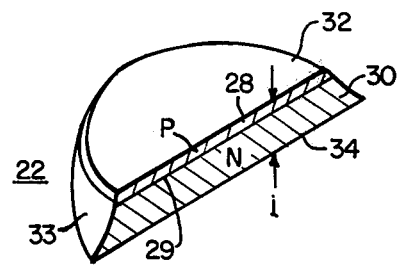
FIG. 2 is a drawing illustrating the body of semiconductor material utilized in the diode.

FIG. 8 is a third embodiment of the invention. The reference numerals in FIG. 1 plus 200 have been used to identify similar parts. The modified diode includes two cup-shaped electrodes 226 and 224 whereas diode 20 (FIG. 1) utilizes only one cup-shaped electrode 24.

FIG. 9 illustrates a fourth embodiment of the diode 320. The same numbers used in FIG. 1 plus 300 have been used to identify similar parts. The diode 320 has been modified to include an annular-shaped glass member having two regions 344 and 354. The first region 354 is a thin layer overlying the PN junction 329. This structure permits the use of region 354 of a silicon oxide overlying the PN junction 329 to minimize any possible contamination of the PN junction 329.

The processes used to construct all embodiments of the diode discussed above are similar. Therefore, the process for constructing the diode 20 illustrated in FIG. 1 will first be described and then the modification necessary to construct the other embodiments will be discussed.

The first step in constructing the diode 20 is to affix the bottom electrode 26 and the top electrode 24 to the body of semiconductor material 22 to form the fusion. In the preferred embodiment bottom electrode 26 is affixed to the body of semiconductor material 22 by silver-soldering top surface 41 of electrode 26 to the bottom major surface 34 of the body of semiconductor material 22. Silver solders are available to permit this process to be carried out temperatures ranging from 800° C. to 900° C.

The top electrode 24 is affixed to the top surface 32 of the body of semiconductor material 22 by soldering or brazing bottom surface 40 of electrode 24 to the top surface 32 of the body of semiconductor material 22 using aluminum. Suitable prior processes are available for performing this operation at temperatures ranging from 500° C. to 550° C.

In general, electrodes 24 and 26 may be affixed to semiconductor body 22 using any suitable process known to those skilled in the art.

After the electrodes 24 and 26 have been affixed to the body of semiconductor material 22, the edge of the body of semiconductor material 22 is beveled to complete the fusion. This is preferably done by sandblasting followed by a chemical polishing and etching in a mixture consisting of hydrofluoric, nitric and acetic acids. This polishing technique is well known in the semiconductor industry and can be performed using commercially available etchants and equipment.

Diode 20 is constructed from the fusion described above, a glass preform 60 (FIG. 10) and the annular-shaped metallic member 48 (FIG. 5). The first step in constructing diode 20 is to clean these parts using the following procedure:

(a) boil all the components in reagent grade trichloroethane (b) rinse all components twice (one minute each time) in reagent grade trichloroethane (c) rinse all the components ultrasonically twice (one minute each time) in reagent grade acetone and (d) dry in room air on filter paper.

Figure 11:
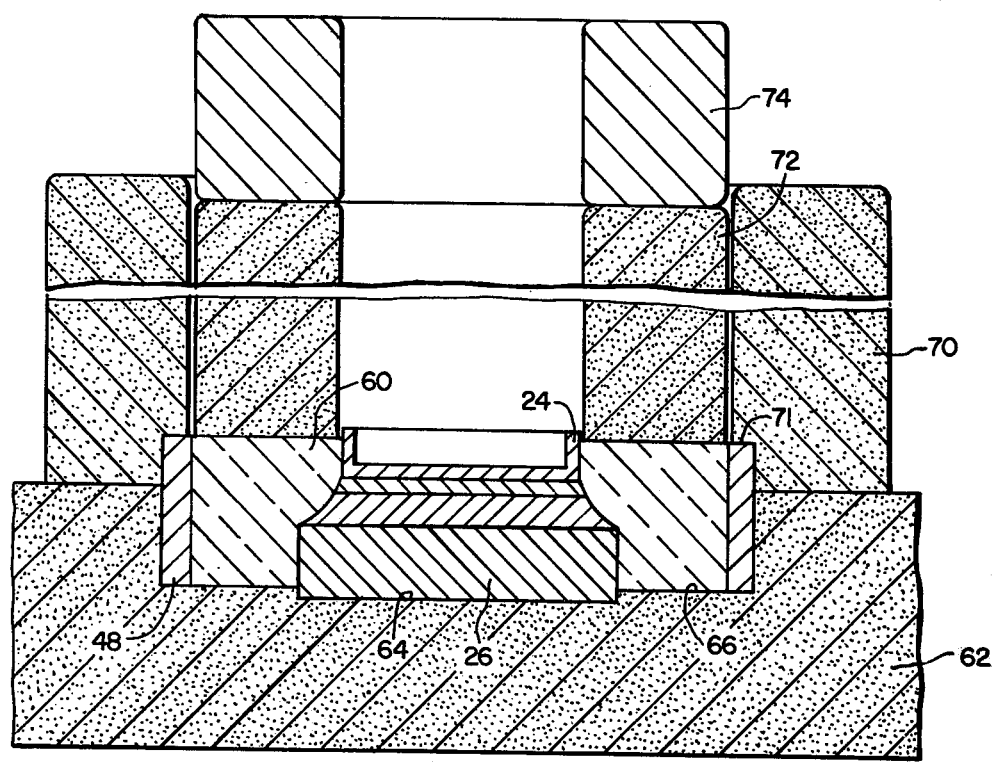
FIG. 11 is a cross section drawing of a jig used to hold the components of the diode during the fusion process.

Following cleaning, as described above, all the components are assembled in a jig as illustrated in FIG. 11. The jig utilizes a graphite base member 62 which includes two concentric circular recesses, 64 and 66. The first recess 64 has a diameter slightly larger than the bottom electrode 26. The second recess 66 is concentric with the first recess 64 and has a diameter slightly larger than the outer diameter of the annular metallic member 48.

In assembling the components of the diode 20 in the jig, the fusion is positioned such that the lower electrode 26 is in the first recess 64. Annular metallic member 48 is placed in the larger recess 66. Glass preform 60 is positioned between the fusion and the annular metallic member 48.

A graphite support cylinder 70 having a recess, 71 along its inner wall, is placed over the annular metallic member 48. The larger recess 66 is base member 62 and the recess 71 in the inner wall of support cylinder 70 are such that the upper surface of annular metallic member 48 is in contact with both the base member 62 and the support cylinder 70.

A graphite pressure cylinder 72 having an outer diameter slightly smaller that the inner diameter of the support cylinder 70 and an inner diameter slightly larger than the outer diameter of the top electrode 24 is positioned to overlie the glass perform 60. A weight 74 is then placed on pressure cylinder 72 to complete the assembly of the components in the jig. The combination of the pressure cylinder 72 and the weight 74 is in the range of 20 to 110 grams. The jig may be made to support a plurality of diodes. However, each diode should be supported as discussed above.

The jig and the components as assembled in FIG. 11 are then placed in a fusion furnace having an initial temperature in the range of 350° C. and heated in a controlled atmosphere to fuse the glass comprising preform 60 to the outer edge of the fusion and the inner edge of annular-shaped member 48. After the fusion process is complete, the glass preform becomes annular-shaped glass member 44 (FIG. 1).

The preferred controlled atmosphere mentioned above consists of nitrogen containing about 5 to 20% water vapor is established in the furnace. The 5 to 20% water vapor is achieved by mixing approximately two parts of dry nitrogen with one part of wet nitrogen and flowing the mixture through the furnace. Dry nitrogen is passed through one inch of deionized water in a bubbler to form the required wet nitrogen. After the required atmosphere has been established, the temperature of the furnace is increased and decreased in accordance with the time/temperature chart illustrated in FIG. 12.

Figure 12:
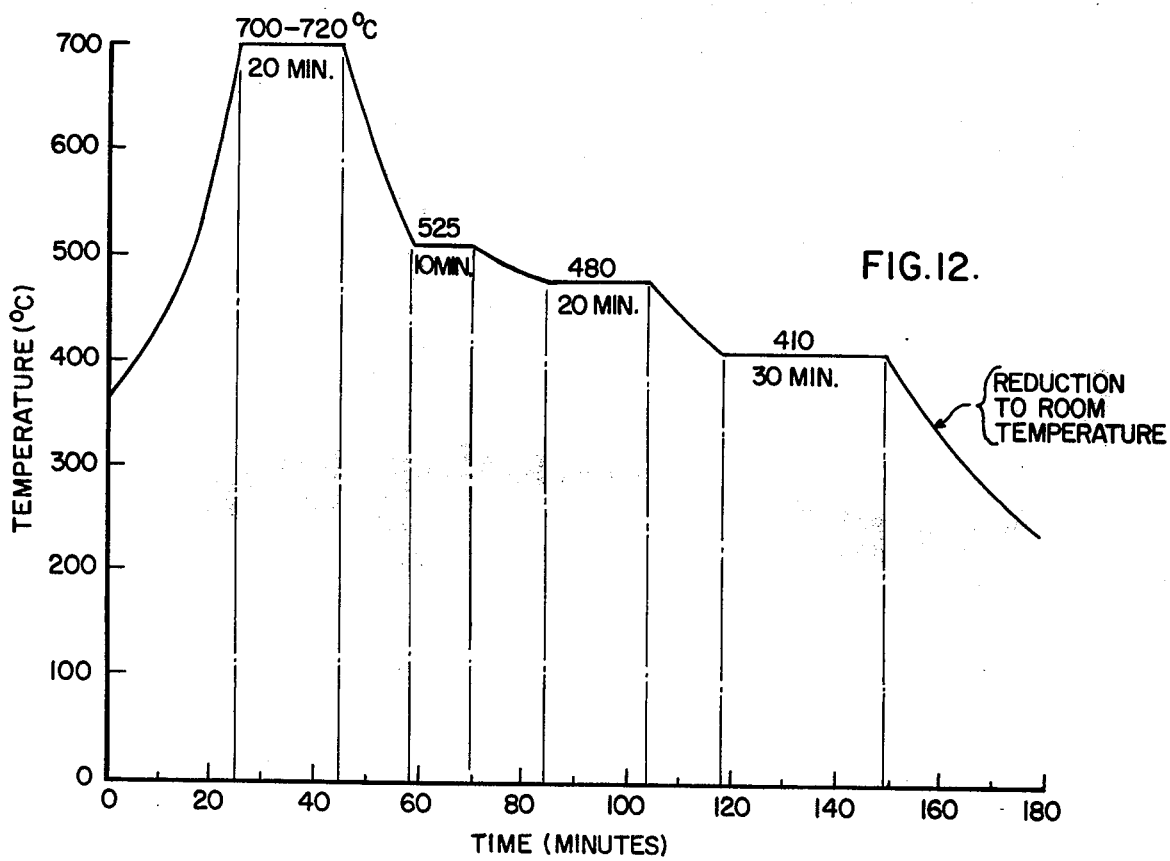
FIG. 12 is a chart illustrating the time/temperature profile of the furnace used to fuse the glass preform to the edge of the semiconductor body to produce a protective seal over the PN junction of the diode.

As can be seen from FIG. 12, the temperature of the furnace is initially at about 350° C. The temperature is increased to a temperature in the range of 700°–720° C. in a time interval of twenty-five minutes. This temperature is maintained for a period of approximately 20 minutes. Glass preform 60 melts at a temperature below 700° C., therefore maintaining a furnace temperature in the range of 700°–720° C. for 20 minutes causes glass perform 60 to melt forming a high viscosity mass. Pressure due to pressure cylinder 72 and weight 74 causes the molten glass to flow evenly along the edges of the body of semiconductor material 22, the outer edges 42 and 34 of electrodes 24 and 26 and the inner edge 50 of annular metallic member 48.

Next, the furnace is cooled from 720° C. to approximately 525° C. in approximately 10 minutes. The furnace temperature is maintained at 525° C. for approximately 10 minutes followed by a reduction to 480° C. in about 15 minutes. A temperature of 480° C. is maintained for of 20 minutes followed by a reduction to 410° C. in a period of 15 minutes. The temperature of 410° C. maintained is for 30 minutes followed by a rapid reduction of the furnace temperature to room temperature at a rate in the range of 10 degrees per minute.

This thermal cycle prevents formation of possibly harmful stresses from developing in the glass member.

The process for constructing the embodiments illustrated in FIGS. 7 and 8 is identical to the abovedescribed process for constructing the embodiment illustrated in FIG. 1. One additional process step is required to form the insulating layer 354 protecting the PN junction of the embodiment illustrated in FIG. 9. Prior to assembling the components of the diode in the jig, illustrated in FIG. 11, insulating layer 354 may be formed on the edge of the semiconductor body 22 by vapor depositing silicon oxide. The fusion and the other components of the diode 320 are then assembled in the jig and processed as previously described.

In selection A glass for the annular glass member 44 as well as the surrounded metal ring 48 it is important that the temperature expansion coefficient for the glass be matched to or greater than the temperature expansion coefficient for the semiconductor body 22. The temmperature expansion coefficient of the glass should also be less than the temperature expansion coefficient for the annular-shaped metal ring 48. If this relationship is maintained, the ring 48 will maintain the glass insulating member 44 is compression preventing the glass from cracking or parting from the edges of the semiconductor body 22.

Glasses suitable for use in this invention should have a temperature expansion coefficient in the range of 4.0 to $6.0 \times 10^{-6}$ (cm/cm/°C.) and be free of substantially all alkali ions.

In addition:
(1) The glass must have structural stability, e.g., must not devitrify or go through phase separation during the sealing and annealing period.
(2) The glass must have good chemical resistance to the environment and humidity.
(3) The glass must have thermal expansion characteristics compatible with those of silicon.
(4) The glass must wet and adhere to the silicon body.
(5) The glass must have a viscosity low enough to flow.
(6) The glass must not chemically attack the device surfaces in a detrimental way.
(7) The thermal characteristics of the glass must be such that stress can be relieved at temperatures within the limitations of the device.
(8) The glass must have a fusion temperature below the degradation temperature of the device.
(9) The finished device must be resilient against thermal shock, thermal cycling and have good mechanical strength.

Glasses having a chemical composition, by weight, of:

| Constituent | Percent |
|---|---|
| $SiO_2$ | 32–40 |
| $B_2O_3$ | 12–23 |
| PbO | 42–48 |
| $Al_2O_3$ | 2–6 | have been found to be suitable.

In particular a glass having a composition of:

| Constituent | % by Weight |
|---|---|
| $SiO_2$ | 36±4 |
| $B_2O_3$ | 15±3 |
| PbO | 45±3 |
| $Al_2O_3$ | 3±1 | has been found to be particularly satisfactory. This glass is sold commercially by Inotech under the Type No. IP745.

The glass preform 60 (FIG. 10) used to construct the diode has the following dimensions:

| Dimension Identification Character | Dimension in Inches |
|---|---|
| k | 0.087 |
| l | 0.015 |
| m | 0.063 |
| n | 0.630 |
| o | 0.080 |

In the preferred embodiment glass preform 68 is one solid member. However, glass preform 68 can be divided into two sections, 69a and 69b, with the two sections being a different type of glass. When a preform consisting of two sections, 69a and 69b is used, the first section 69a fuses to the edge portion 30 of the body of semiconductor material 122 and to the edge 138 of the top electrode 124. The second section 69b fuses to the edge 143 of bottom electrode 126. This results in annular-shaped glass member 144 having two regions, 144a and 144b, having a junction indicated by dotted line 169. This embodiment permits the glass for the first section 144a to be selected to have characteristics which provide optimum protection for the PN junction 129. The glass for the second section can be selected primarily for its other electrical and thermal properties.

Additionally it should be noted that although one bottom corner of portion 69a is shown as rounded in FIG. 10, this corner can also be substantially square. In any case it should be noted that the height (dimension o) exceeds the height (dimension d) of the annular-shaped metallic member 48. This assures that the pressure cylinder 72 (FIG. 10) will maintain pressure on the perform during the fusion process and that sufficient glass will be available so that annular-shaped glass member 44 (FIG. 1) has top and bottom edges substantially even with the top and bottom edges of annular-shaped metallic member 48.

The detailed method of constructing the diode described above is not part of this invention. This process set forth herein was developed by B. E. Yoldas and is the claimed subject matter of Ser. No. 897,323 filed Apr. 18, 1978. The above-described process is included for the purpose of illustrating the preferred method of constructing the diodes comprising the invention at the time this application is being filed.

We claim:

1. A semiconductor diode, comprising:
   (a) a body of semiconductor material having opposed substantially flat parallel top and bottom surfaces with an edge portion extending between said top and bottom surfaces, said body of semiconductor material including at least two regions of opposite conductivity type respectively extending to said substantially flat top and bottom surfaces, with the interface of said at least two regions formming a PN junction therebetween, said PN junction extending across said body of semiconductor material and terminating at said edge portions;
   (b) first and second electrodes respectively affixed to said top and bottom surfaces of said body of semiconductor material; and
   (c) a first ring-shaped member encircling said body of semiconductor material and spaced therefrom by a ring-shaped glass member, said ring-shaped glass member having an inner surface which is fused to said edge portion of said body of semiconductor material.

2. A semiconductor diode in accordance with claim 1 wherein said ring-shaped glass member has a temperature expansion coefficient in the order of 3.5 to $4.5 \times 10^{-6}$ (cm/cm/°C.).

3. A semiconductor diode in accordance with claim 2 wherein the glass comprising said ring-shaped glass member is substantially free of alkali elements.

4. A semiconductor diode in accordance with claim 3 wherein the glass comprising said ring-shaped glass member is composed by weight of 36%±4% $SiO_2$, 17.5%±5.5% $B_2O_3$, 45±3% $P_bO$ and 4.0%±2% $Al_2O_3$.

5. A semiconductor diode in accordance with claim 4 wherein the glass comprising said ring-shaped glass member is composed by weight of 36%±4% $SiO_2$, 15%±3% $B_2O_3$, 45%±3% $P_bO$ and 3%±1% $Al_2O_3$.

6. A semiconductor diode in accordance with claim 5 wherein said first ring-shaped member consists of a metal selected from a group consisting of:
   an alloy comprising substantially 20% nickel, 17% cobalt with the balance iron;
   steel;
   titanium; and
   phosphor bronze.

7. A semiconductor diode comprising,
   (a) a body of semiconductor material having opposed substantially flat parallel top and bottom surfaces with an edge portion extending between said top and bottom surfaces, said body of semiconductor material including at least two regions of opposite conductivity type respectively extending to said substantially flat top and bottom surfaces with the interface of said at least two regions forming a PN junction therebetween, said PN junction extending across said body of semiconductor material and terminating at said edge portion;
   (b) first and second electrodes repsectively affixed to said top and bottom surfaces of said body of semiconductor material;
   (c) a ring-shaped metallic member coaxially encircling said body of semiconductor material and spaced therefrom by a ring-shaped glass member, said ring-shaped glass member including a first region fused to said edge portion of said body of semiconductor material and to an edge of said first electrode and a second region fused to said first region and an edge of said second electrode.

8. A semiconductor diode comprising:
   (a) a body of semiconductor material having opposed substantially flat parallel top and bottom surfaces with an edge portion extending between said top and bottom surfaces, said body of semiconductor material including at least two regions of opposite conductivity type respectively extending to said substantially flat top and bottom surfaces with the interface of said at least two regions forming a PN junction therebetween, said PN junction extending across said body of semiconductor material and terminating at said edge portion;

(b) first and second electrodes respectively affixed to said top and bottom surfaces of said body of semiconductor material; and (c) a ring-shaped metallic member coaxially encircling said body of semiconductor material and spaced therefrom by a region of silicon oxide overlying the fused to said edge portion of said body of semiconductor material and a ring-shaped glass member fused to edge portions of said first and second electrodes and said region of silicon oxide.

9. A semiconductor diode comprising:

(a) a body of semiconductor material having opposed substantially parallel flat top, and bottom surfaces with an edge portion extending between said top and bottom surface, said semiconductor body including a PN junction formed along the interface of a first region of P conductivity type and a second region of N conductivity type, said first and second regions respectively extending to said top and bottom surfaces from said PN junction of said semiconductor body;

(b) first and second electrically conductive members each having first and second substantially flat opposed surfaces and a circular edge surface, said first substantially flat surface of said first electrically conductive members being affixed to said substantially flat top surface of said semiconductor body, said first substantially flat surface of said second electrically conductive member being affixed to said substantially flat bottom surface of said semiconductor body;

(c) a ring-shaped glass member coaxially encircling and fused to at least said edge portion of said semiconductor body; and (d) a ring-shaped metallic member having top, bottom inner edge and outer edge surfaces, said annular metallic member coaxially encircling said ring-shaped glass member with an outer edge of said glass member in contact with said inner edge of said metallic member.

10. A semiconductor diode in accordance with claim 9 wherein said first and second electrically conductive members are attached to said semiconductor structure by brazing.

11. A semiconductor diode in accordance with claim 10 wherein said first and second electrically conductive contacts are molybdenum.

12. A semiconductor diode in accordance with claim 11 wherein said first electrically conductive member is thicker than said second electrically conductive member.

13. A semiconductor diode in accordance with claim 12 wherein said said second electrically conductive member is cup-shaped.

14. A semiconductor diode in accordance with claim 13 wherein the material for said annular metallic member and said annular glass member are selected such that said annular glass member is maintained in compression.

15. A semiconductor diode, comprising, (a) a disc-like semiconductor body having substantially flat top and bottom surfaces and a circular edge surface, said semiconductor body including at least two regions of opposite conductivity type, respectively extending to said substantially flat top and bottom surfaces, said at least two regions of opposite conductivity type forming a PN junction therebetween, said PN junction extending to said circular edge surface of said semiconductor body;

(b) first and second electrodes respectively affixed to said top and bottom surfaces of said semiconductor body; and (c) a first annular-shaped member coaxially encircling said disc-like semiconductor body and spaced therefrom by a second annular-shaped gas and liquid impervious electrically insulating member, said second annular-shaped gas and liquid impervious electrically insulating member forming a gas and liquid impervious seal along said circular edge surface of said disc-like semiconductor body and overlying said PN junction.

16. A semiconductor device in accordance with claim 15 wherein said second annular-shaped gas and liquid impervious member is glass.

17. A semiconductor diode in accordance with claim 16 wherein said first annular-shaped member is metal.

18. A semiconductor device in accordance with claim 17 wherein said first annular-shaped member is steel.

* * * * *